(12) United States Patent
Mingviriya

(10) Patent No.: US 7,108,535 B1
(45) Date of Patent: Sep. 19, 2006

(54) INTEGRATED CIRCUIT TEST SOCKET

(75) Inventor: Somboon Mingviriya, Fremont, CA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 11/180,943

(22) Filed: Jul. 12, 2005

(51) Int. Cl.
*H01R 13/62* (2006.01)

(52) U.S. Cl. .......................... 439/331; 439/70

(58) Field of Classification Search ............... 439/330, 439/331, 70, 71, 73, 525
See application file for complete search history.

(56) References Cited

U.S. PATENT DOCUMENTS

| | | | | |
|---|---|---|---|---|
| 5,139,437 | A * | 8/1992 | Ikeya et al. | 439/266 |
| 5,290,192 | A * | 3/1994 | Espenshade et al. | 439/266 |
| 6,036,503 | A | 3/2000 | Tsuchida | |
| 6,162,066 | A * | 12/2000 | Glick et al. | 439/73 |
| 6,464,511 | B1 | 10/2002 | Watanabe et al. | |
| 6,517,370 | B1 * | 2/2003 | Fukunaga | 439/331 |
| 6,544,044 | B1 | 4/2003 | Akasaka | |
| 6,739,894 | B1 * | 5/2004 | Ogura | 439/330 |
| 6,814,602 | B1 * | 11/2004 | Gattuso et al. | 439/331 |
| 6,848,928 | B1 * | 2/2005 | Ikeya et al. | 439/331 |
| 6,957,965 | B1 * | 10/2005 | Huang et al. | 439/70 |

FOREIGN PATENT DOCUMENTS

JP  2004-325393  11/2004

* cited by examiner

*Primary Examiner*—Hien Vu
(74) *Attorney, Agent, or Firm*—Ingrassia Fisher & Lorenz P.C.

(57) ABSTRACT

A test socket is provided for use in testing integrated circuits, especially integrated circuits in BGA packages. The test socket comprises a base member and a cover member configured to move vertically between an upper position and a lower position with respect to the base member. Springs are positioned between the base member and the cover member and configured to bias the cover member in the upper position. A lever is coupled to the base member and to the cover member and is configured to pivot to an open position when the cover member is in the lower position and to pivot to a closed position to confine an integrated circuit within the base member when the cover member is in the upper position.

18 Claims, 5 Drawing Sheets

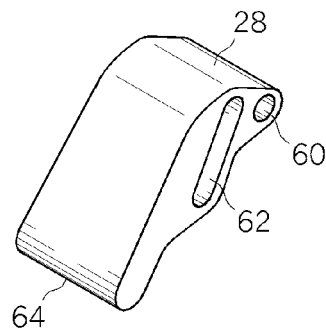
FIG. 7
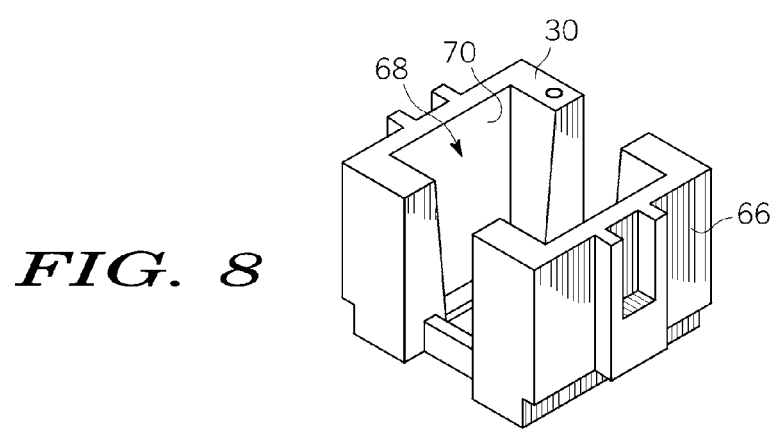
FIG. 8
FIG. 9
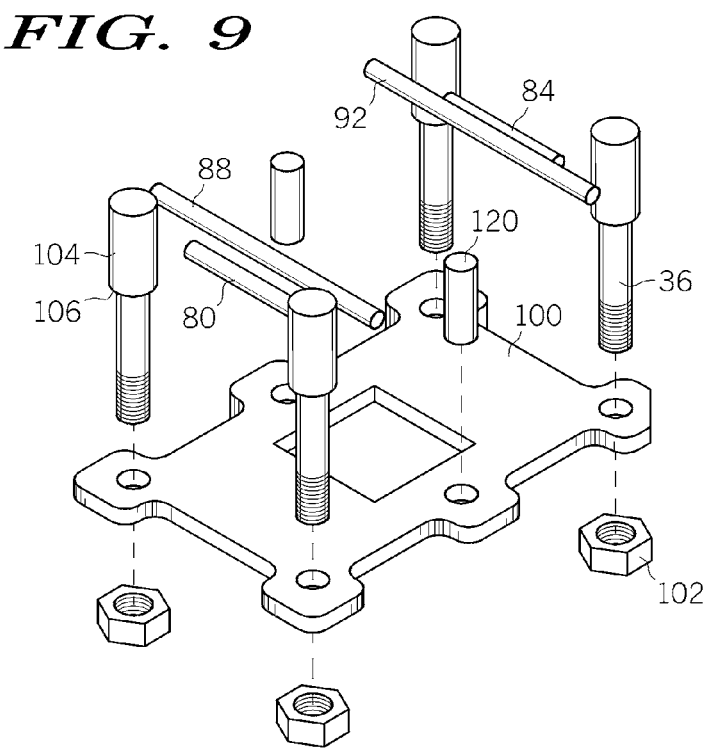

INTEGRATED CIRCUIT TEST SOCKET

TECHNICAL FIELD OF THE INVENTION

The present invention generally relates to integrated circuit test sockets, and more particularly relates to IC test sockets for BGA packages that provide flexibility in package size and ball count and arrangement.

BACKGROUND OF THE INVENTION

Many of the integrated circuits (ICs) fabricated today are mounted in a ball grid array (BGA) package. The BGA package has a plurality of solder balls (often hundreds of solder balls) on its undersurface that are coupled to device terminals on the integrated circuit chip. In use, the solder balls are soldered to a printed circuit board to achieve the proper interconnection between the circuitry on the printed circuit board and the integrated circuit. Before any IC can be sold it must be tested to insure that the device meets the intended specification. Testing an IC in a BGA package requires holding the plurality of solder balls of the IC package against electrodes (often spring loaded electrical contacts known as POGO pins) that are connected to a testing apparatus. Holding the solder balls against the electrodes usually requires a test socket that precisely aligns the large number of small, closely spaced solder balls to the test electrodes. Present day test sockets are usually useful for only a single package size and type with a single predetermined array of solder balls. Thus if a device is mounted in a package of a different size or having a different array of solder balls, a new test socket must be used. Requiring a new test socket is both expensive and time consuming because of the lead time to design and acquire the new socket. Such sockets are also prone to damaging the solder balls and are not particularly amenable to automated insertion and unloading of the integrated circuits being tested.

Accordingly, it is desirable to provide an integrated circuit test socket that can be readily changed to accommodate different BGA package sizes and arrays of solder balls. In addition, it is desirable to provide an IC test socket into which it is easy to automatically insert devices for test and that does not damage the solder balls on the IC package. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

A test socket is provided for use in testing integrated circuits, especially integrated circuits in BGA packages. The test socket comprises a base member and a cover member configured to move vertically between an upper position and a lower position with respect to the base member. Springs are positioned between the base member and the cover member and configured to bias the cover member in the upper position. A lever is coupled to the base member and to the cover member and is configured to pivot to an open position when the cover member is in the lower position and to pivot to a closed position to confine an integrated circuit within the base member when the cover member is in the upper position.

BRIEF DESCRIPTION OF THE DRAWINGS

The present invention will hereinafter be described in conjunction with the following drawing figures, wherein like numerals denote like elements, and wherein

FIG. 7 illustrates, in perspective view, a lever for use in an IC test socket;

FIG. 8 illustrates, in perspective view, an interchangeable device guide insert for use in an IC test socket; and FIG. 9 illustrates, in exploded perspective view, hardware for use in an IC test socket.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
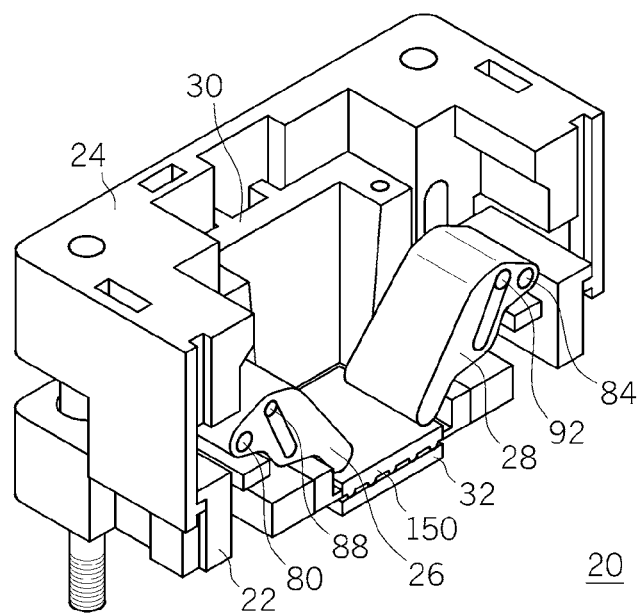
FIGS. 1 and 2 illustrate, in partial cut away perspective views, an IC test socket in its closed and open positions, respectively in accordance with one embodiment of the invention.
Figure 2:
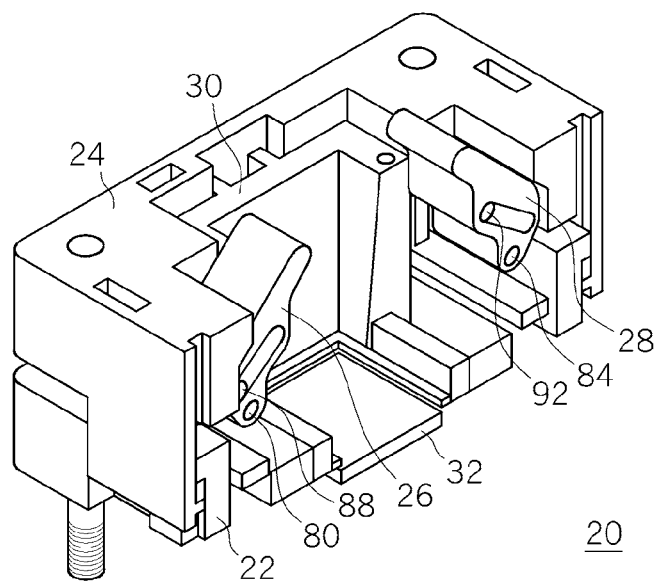

FIGS. 1 and 2 illustrate, in partially cut away perspective view, an integrated circuit test socket 20 in accordance with an embodiment of the invention. Although referred to throughout as a "test socket," those of skill in the art will recognize that the inventive socket can also be used as a burn in socket or as a programming socket. The term "test socket" therefore will be used herein to refer, without limitation, to sockets for any such uses with BGA packaged integrated circuits. FIG. 1 illustrates the test socket in the closed position and FIG. 2 illustrates the same test socket in the open position. As viewable in these figures and in accordance with this embodiment of the invention, integrated circuit test socket 20 includes a base member 22, a cover member 24, two latches 26 and 28, and an interchangeable device guide insert 30. In the closed position latches 26 and 28 contact an integrated circuit BGA package 150 (shown in phantom) and press the array of solder balls on the bottom surface of that package against a contact set 32 on an integrated circuit test board (not illustrated), the contact set comprising a plurality of electrodes arranged in a predetermined array to match the array of solder balls on the lower surface of the BGA package. In the open position latches 26 and 28 pivot to positions out of contact with the BGA package so that the package can be removed from the test fixture (for example by using a vacuum pickup) and another IC to be tested can be dropped into the test socket. Although not shown in these figures, the base member is attached to the integrated circuit test board. In fact, for the rapid and automated testing of a large number of identical ICs, tens or even hundreds of similar IC test sockets may be attached to rows and rows of locations on the IC test board. As can be seen by comparing FIGS. 1 and 2, cover member 24 is configured to slideably move vertically with respect to base member 22 between an upper position illustrated in FIG. 1 and a lower position as illustrated in FIG. 2. As will be explained more fully below, the vertical movement of cover member 24 with respect to the position of base member 22 causes the two latches to pivot between the closed and open positions.

Figure 3:
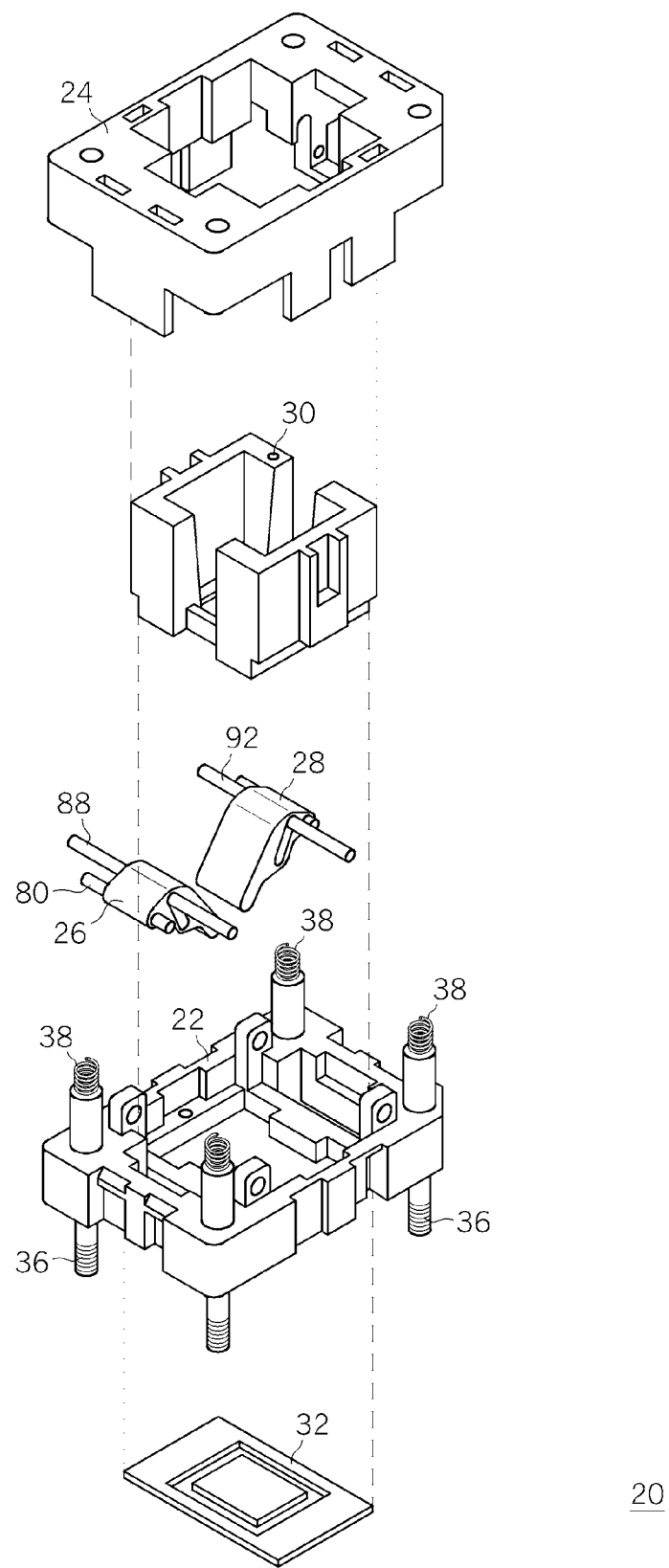
FIG. 3 illustrates, in an exploded perspective view, major components of an IC test socket.

FIG. 3 illustrates, in an exploded perspective view, the major components of integrated circuit test socket 20 in accordance with one embodiment of the invention. Base member 22, which is also illustrated in top perspective view in FIG. 4 includes a shaped interior cavity 33 into which device guide insert 30 is press fit. Holes 34 are provided at the corners of the base member and through which dowel pins 36 protrude. The dowel pins (shown in phantom in FIG. 4) are used to secure the base member to an integrated circuit test board 152 (not illustrated in FIG. 3, but shown in phantom in FIG. 4) and also provide guides for the vertical motion of cover member 24. Springs 38, schematically illustrated in the figure, are positioned between the dowel pins and blind holes in the underside of cover member 24. In the extended position the springs push the cover member to its up upper position.

Figure 4:
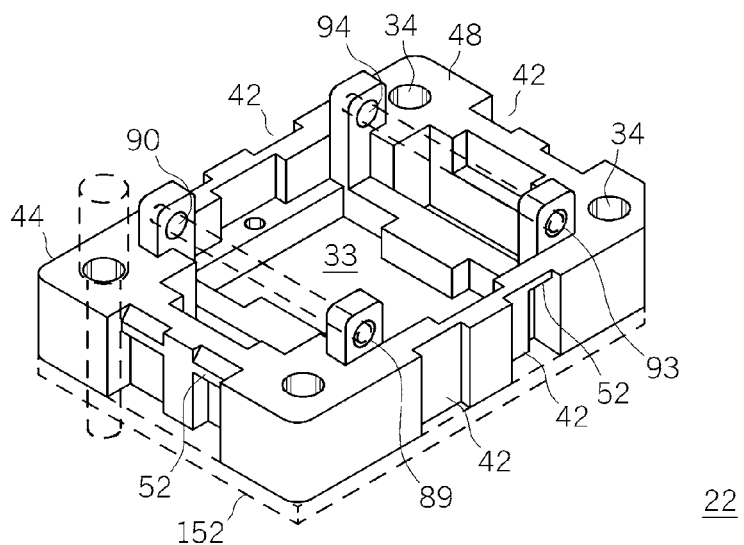
FIG. 4 illustrates, in perspective view, a base member for an IC test socket.
Figure 5:
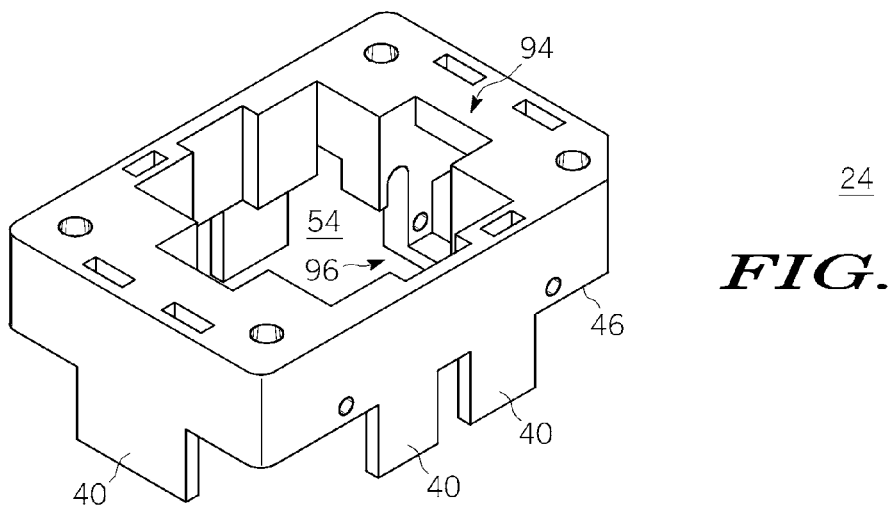
FIGS. 5 and 6 illustrate, in top and bottom perspective views, respectively, a cover member for an IC test socket.
Figure 6:
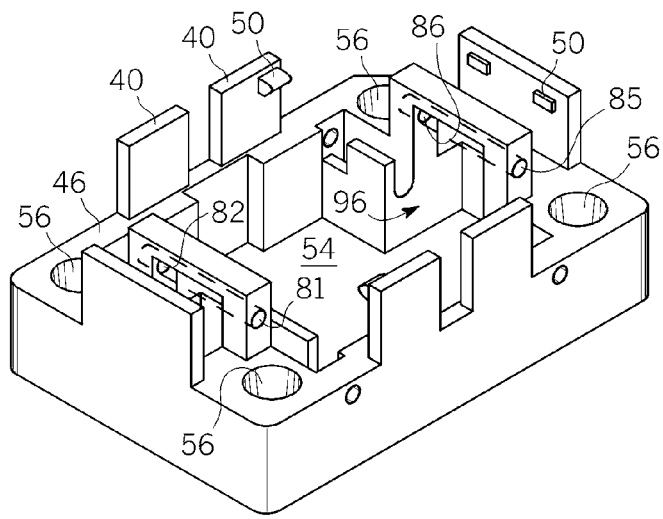
Figure 10:
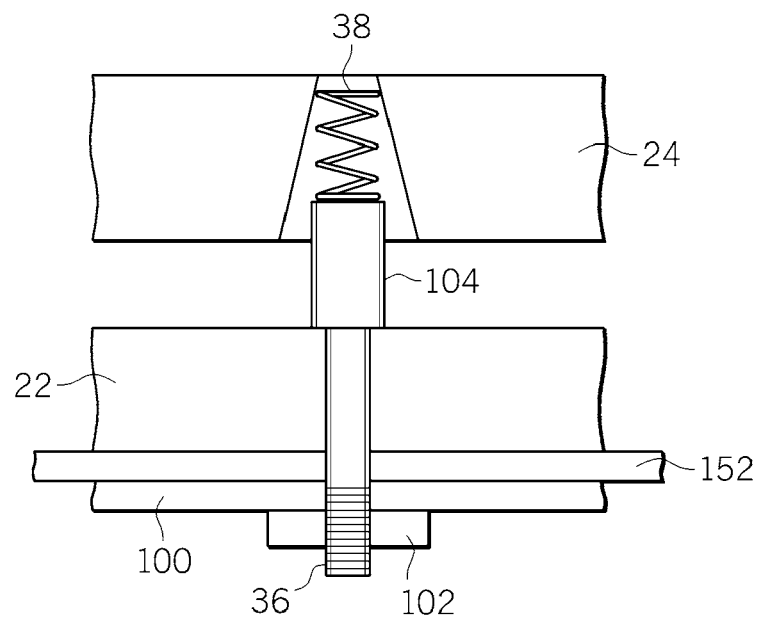
FIGS. 10 and 11 illustrate, in cross section through a corner of the IC test socket the action of a spring in enabling the closed and open positions.
Figure 11:
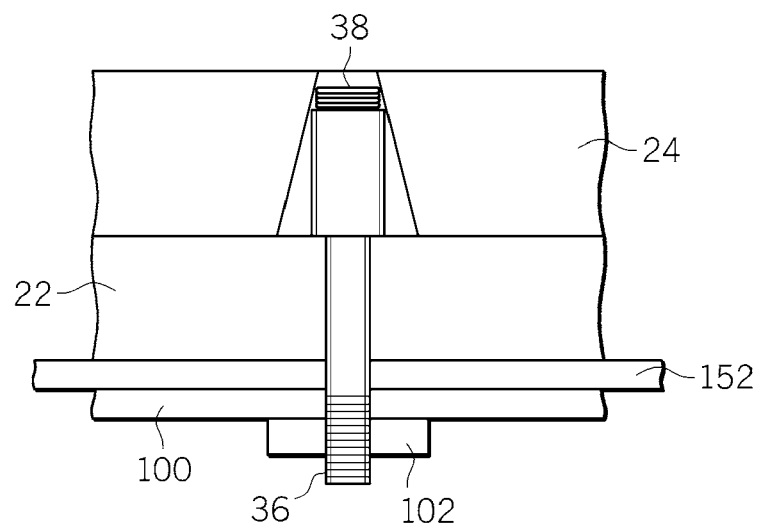

FIGS. 5 and 6 illustrate cover member 24, in accordance with an embodiment of the invention, in top and bottom perspective views, respectively. The relationship between the cover member and the base member can be seen by again referring to FIG. 4 as well as to FIGS. 5 and 6. A plurality of fingers 40 extend from the main body of cover member 24. The fingers are positioned to ride vertically in grooves 42 formed in the exterior peripheral surface 44 of base member 22. The cover member is constrained to move between a lower position in which lower surface 46 of the cover member is in contact with upper surface 48 of base member 22 and an upper position. At least one, and preferably several, of the fingers include a tab portion 50 that protrudes from the finger. At least one, and preferably several, of grooves 42 on the base member include a ridge. 52. As the cover member moves upwardly with respect to the base member the tab portion hits against the ridge and limits the vertical movement of the cover member. The tab and the ridge thus form a stop mechanism that defines the upper limit for the vertical movement of the cover member. Cover member 24 has an opening 54 through which an IC to be tested can be inserted into and removed from interchangeable device guide insert 30. As can be seen in FIG. 6, holes 56 are provided at the corners of the underside of cover member 24. The holes engage with the top portion of dowel pins 36, and the cover member slides vertically on these pins. The dowel pins limit the movement of the cover member to motion in the vertical direction only. Preferably holes 56 are blind holes and springs 38 bottom out in the blind end of the holes. FIGS. 10 and 11 illustrate, in cross section through a corner of integrated circuit test socket 20, the action of spring 38 to raise cover member 24 to the open position away from base member 22 on upper portion 104 of dowel pin 36 when the spring is in its uncompressed state and to allow the cover member to lower to the closed position when spring 38 is compressed.

FIG. 7 illustrates, in perspective view, a latch 28 in accordance with an embodiment of the invention. Latch 28, and a similar latch 26, include a hole 60 at one extremity and an elongated guide slot 62 at a middle portion thereof. Each of the latches includes a finger portion 64 at the extremity opposite hole 60. When pivoted to the closed position the finger portion pushes against the top surface of the package of the integrated circuit being tested and seats the solder balls on the bottom of that package against electrical contacts on contact set 32.

FIG. 8 illustrates, in top perspective view, an interchangeable device guide insert 30 in accordance with an embodiment of the invention. Insert 30 has a periphery 66 that is designed to mate with the shaped inner cavity 33 of base member 22 as illustrated in FIG. 4. Preferably periphery 66 and inner cavity 33 are both asymmetric so that the device guide insert can fit into the inner cavity in only one orientation. The device guide insert has an opening 68 extending through the thickness thereof. The inner periphery 70 of opening 68 is configured to align an integrated circuit to be tested with the plurality of electrical contacts on contact set 32. In accordance with the invention, the interchangeable device guide insert can be changed to accommodate a package having a different shape or size without having to change the entire IC test socket. If a different sized IC device package is to be tested, a different device guide insert 30 can be inserted through opening 54 in cover member 24 so that the insert can be changed without removing base member 22 from the IC test board. Contact set 32 can also be changed to change the number, spacing, and arrangement of electrical contacts to accommodate a different package, also without changing any other component of the IC test socket. Because only the interchangeable device guide insert, and possibly the contact set, need to be changed to accommodate a different IC package, the lead time and the expense of changing to a new package size is greatly reduced. One advantage of the test socket in accordance with the invention is that interchangeable device guide insert 30 and interchangeable contact set 32 allow a wide variety of package sizes and a wide variety of ball arrays to be tested with the same test socket. The only limitation on the variety of packaged IC that can be tested is the size of the device guide insert and hence the package that can be accommodated within the inner cavity of the base member.

Reference is again made to FIGS. 1–4, 6, and 7. A dowel 80 passes through hole 60 in latch 26. Dowel 80 also passes through holes 81 and 82 in cover member 24 as illustrated in phantom in FIG. 6. In a similar manner dowel 84 passes through hole 60 in latch 28 and through holes 85 and 86 in cover member 24 as also illustrated in phantom in FIG. 6. Dowel 88 passes through elongated guide slot 62 in latch 26 and also through holes 89 and 90 in base member 22 as illustrated in phantom in FIG. 4. In a similar manner dowel 92 passes through elongated guide slot 62 in latch 28 and through holes 93 and 94 in base member 22 as also illustrated in phantom in FIG. 4. When cover member 24 in pressed down by an external force to the lower position as illustrated in FIG. 2, compressing springs 38 positioned between the cover member and base member 22, dowels 80 and 84 are also pressed downward. Pressing downward on dowels 80 and 84 while dowels 88 and 92 are fixed to the unmoving base member causes levers 26 and 28 to each pivot to an open position as elongated guide slot 62 slides along dowels 88 and 92. In the open position levers 26 and 28 are retracted to allow an IC that is to be tested to be placed in or removed from the interchangeable device guide insert 30. In a preferred embodiment of the invention cover member 24 has a recess 94 into which lever 26 is retracted and a recess 96 into which lever 28 is retracted.

After the package of an IC to be tested is placed in interchangeable device guide insert 30, the external force pushing down on cover member 24 is released and the cover member slides vertically to the upper position under the influence of springs 38. The cover member rises to the upper position at which tabs 50 come into contact with ridges 52. As the cover member slides vertically to the upper position, dowels 80 and 84, coupled to the cover member, also move upward. The upward movement of dowels 80 and 84, while dowels 88 and 92 are fixed, causes levers 26 and 28 to pivot to the closed position with lever fingers 64 pressing against the top surface of the IC package. The levers remain in this closed position under the influence of springs 38 until an external force is again applied to the top of cover member 24.

FIG. 9 illustrates, in explodes perspective view, hardware for the integrated test socket in accordance with one embodiment of the invention. Preferably the hardware includes a firm gasket 100 that can be positioned under the integrated circuit test board in alignment with the inventive integrated circuit test socket. Gasket 100 can be formed of Kapton or other rigid insulator material. Preferably the gasket is attached to the bottom of the IC test board with an adhesive. Dowel pins 36 pass through base member 22 (not illustrated in this figure), the IC test board, and gasket 100 and are secured beneath the gasket by threaded fasteners 102. Preferably each of the dowel pins has an upper portion 104 having an increased diameter that forms a shoulder 106. When the threaded fasteners are screwed onto the bottom of dowel pins 36 shoulder 106 is tightened down securely against the upper surface of base member 22 to securely fasten the base member in place on the surface of the IC test board. Upper portion 104 of dowel pins 36 extends above the upper surface of base member 22 and provides a support upon which cover member 24 can slide in the vertical direction. Dowels 80, 84, 88, and 92 are also illustrated in FIG. 9 just to indicate their relative position. Also illustrated in FIG. 9 are guide pins 120 that pass through holes in the bottom of device guide insert 30 and align the insert to contact set 32.

Base member 22, cover member 24, levers 26 and 28, and interchangeable device guide insert 30 are all preferably made of an insulating material such as polyetheretherketone (PEEK). Dowels 80, 84, 88, and 92 and dowel pins 38 are preferably made of a rigid material such as stainless steel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit test socket for use with an integrated circuit test board comprising:
   a base member having dowel pins and configured for attachment to the integrated circuit test board;
   a cover member configured for slideable movement between an upper position and a lower position with respect to the base member;
   a device guide insert positioned within the base member and having an inner dimension to position an integrated to be tested with respect to the integrated circuit test board;
   springs positioned on top surface portions of the dowel pins and in between the base member and the cover member and configured to raise the cover member to the upper position when the springs are relaxed and to allow the cover member to assume the lower position when the springs are compressed;
   first and second levers configured to move from a closed position to press an integrated circuit to be tested against the integrated circuit test board when the cover member is in the upper position and to retract to an open position when the cover member is in the lower position;
   first dowels passing through the first and second levers and through the base member; and
   second dowels passing affixed to the first and second levers and affixed to the cover member and configured to move the first and second levers between the closed position when the cover member is in the upper position and the open position when the cover member is in the lower position;
   an elongated guide slot in each of the first and second levers through which the first dowels are positioned.

2. The integrated circuit test socket of claim 1 wherein the base member, cover member, and device guide insert are all fabricated from polyetheretherketone.

3. The integrated circuit test socket of claim 1 wherein the base member is configured for attachment to the integrated circuit test board by the plurality of dowel pins passing through the base member and the integrated circuit test board.

4. The integrated test socket of claim 3 wherein the base member has an upper surface and wherein each of the plurality of dowel pins comprises an upper portion extending above the upper surface.

5. The integrated circuit test socket of claim 4 wherein the cover member has a lower surface and wherein the lower surface comprises a plurality of holes positioned to mate with the upper portion of the plurality of dowel pins upon which the cover member can slideably move.

6. The integrated circuit test socket of claim 1 wherein the base member has a shaped inner cavity and an outer periphery and the device guide insert has a periphery shaped to mate with the shaped inner cavity.

7. The integrated circuit test socket of claim 6 wherein the shaped inner cavity is asymmetrical to prevent misorientation of the device guide insert.

8. The integrated circuit test socket of claim 6 wherein the cover member has a plurality of fingers extending from body portion to mate with the outer periphery of the base member.

9. The integrated circuit test socket of claim 8 wherein the outer periphery of the base member comprises a ridge and at least one of the fingers of the cover member comprises a tab configured to engage the ridge and restrict the slideable movement in the upper position.

10. The integrated circuit test socket of claim 1 wherein the cover member comprises first and second recesses into which the first and second levers locate when the first and second levers are in the open position.

11. An integrated circuit test socket comprising:
    a base member having dowel pins;
    a cover member configured to move vertically between an upper position and a lower position with respect to the base member;
    springs positioned on top surface portions of the dowel pins and in between the base member and the cover member and configured to bias the cover member in the upper position;
    a lever coupled to the base member and coupled to the cover member by a first dowel affixed to the cover member and through a hole in the lever and configured to pivot to an open position when the cover member is in the lower position and to pivot to a closed position to confine an integrated circuit within the base member when the cover member is in the upper position; wherein the lever includes an elongated guide slot and the lever is coupled to the base member by a second dowel affixed to the base member and passing through the slot.

12. The integrated circuit test socket of claim 11 wherein the base member has a shaped inner cavity and wherein the integrated circuit test socket further comprises an interchangeable device guide insert removeably positioned within the cavity, the device guide insert having an inner shape configured to position an integrated circuit to be tested.

13. The integrated circuit test socket of claim 12 further comprising an interchangeable contact set positioned beneath the interchangeable device guide insert.

14. The integrated circuit test socket of claim 11 wherein the base member comprises:
   an outer surface; and
   a stop ridge;
   and wherein the cover member comprises a plurality of fingers configured to slide on the outer surface; and
   a tab on one of the plurality of fingers configured to engage the stop ridge and to limit the vertical movement of the cover member.

15. An integrated circuit test socket for use with an integrated circuit test board having a plurality of electrical contacts, the integrated circuit test socket comprising:
   a base member having an outer surface, an upper surface, and an inner cavity;
   a cover member moveable in a vertical direction with respect to the base member between an upper position and a lower position;
   a plurality of springs positioned between the base member and the cover member and configured to raise the cover member in the vertical direction;
   a first lever and a second lever, each having a hole through one extremity and an elongated guide slot through a middle portion thereof and each configured to pivot between a closed position to contact an integrated circuit to be tested when the cover member is in the upper position and an open position to allow insertion and removal of an integrated circuit when the cover member is in the lower position;
   a first dowel passing through the hole in the first lever and a second dowel passing through the hole in the second lever, each of the first dowel and second dowels affixed to the cover member,
   a third dowel passing through the elongated slot in the first lever and a fourth dowel passing through the elongated slot in the second lever, each of the third dowel and fourth dowel affixed to the base member;
   an interchangeable device guide insert positioned in the cavity of the base member and having an inner periphery configured to align an integrated circuit to be tested with the plurality of electrical contacts; and
   a plurality of pins with the springs positioned on top surface portions thereof and configured to mount the base member on the integrated circuit test board, each of the plurality of pins passing through the base member and having a shoulder for positioning against the upper surface of the base member, the plurality of pins extending above the upper surface and mating with holes formed in the cover member.

16. The integrated circuit test socket of claim 15 wherein the cover member comprises an upper surface having an opening therethrough to allow an integrated circuit to be tested to be inserted through the opening and into the device guide insert when the cover member is in the lower position.

17. The integrated circuit test socket of claim 15 wherein the cover member comprises an inner cavity having a first recess into which the first lever pivots and a second recess into which the second lever pivots when the cover member is in the lower position.

18. The integrated circuit test socket of claim 15 wherein the cover member and the base member comprise a stop mechanism to limit the vertical movement of the cover member with respect to the base member.

* * * * *